United States Patent [19]

Kuroki

[11] Patent Number: 4,639,823
[45] Date of Patent: Jan. 27, 1987

[54] CONTROL CIRCUIT FOR SWITCHING TRANSISTORS

[75] Inventor: Kazuo Kuroki, Tokyo, Japan

[73] Assignee: Fuji Electric Co., Ltd., Kawasaki, Japan

[21] Appl. No.: 682,916

[22] Filed: Dec. 18, 1984

[30] Foreign Application Priority Data

Dec. 27, 1983 [JP] Japan .................. 58-247276

[51] Int. Cl.$^4$ ............ H01H 47/00; H03K 17/60
[52] U.S. Cl. .................. 361/159; 307/300; 307/253
[58] Field of Search .......... 361/159; 307/98, 135, 307/253, 300

[56] References Cited

U.S. PATENT DOCUMENTS 3,243,510  3/1966  Winston ............... 307/300
3,546,492 12/1970  Barchok ............... 307/300
3,852,620 12/1974  Milberger et al. ...... 307/300

OTHER PUBLICATIONS

W. R. Pearson and P. C. Sen, "Designing Optimum Snubber Circuits for the Transistor Bridge Configuration", Department of Electrical Engineering, Queen's University, Kingston, Ontario, Canada K7L3N6, *Electric Machines and Power Systems*, 8:321–332.

*Primary Examiner*—L. T. Hix
*Assistant Examiner*—David M. Gray
*Attorney, Agent, or Firm*—Brumbaugh, Graves, Donohue & Raymond

[57] ABSTRACT

In the particular embodiment of the invention described in the specification, a circuit for interrupting the operation of a switching transistor includes a reactor connected in series with the transistor emitter and a plurality of diodes connected in series between the reactor and the base of the transistor so that the electromotive force induced in the reactor when the reactor current decreases is supplied to the base of the transistor. This makes it possible to maintain the reactor storage time when the transistor is switched off and to adjust the fall time so that the changing rate (di/dt) of the current flowing in a snubber circuit for controlling overvoltage may be minimized so that the structural restrictions imposed on the snubber circuit can be eased and reliability is improved. Noise is also reduced because the current drop rate ($-di/dt$) when the transistor is switched off can be minimized.

1 Claim, 9 Drawing Figures

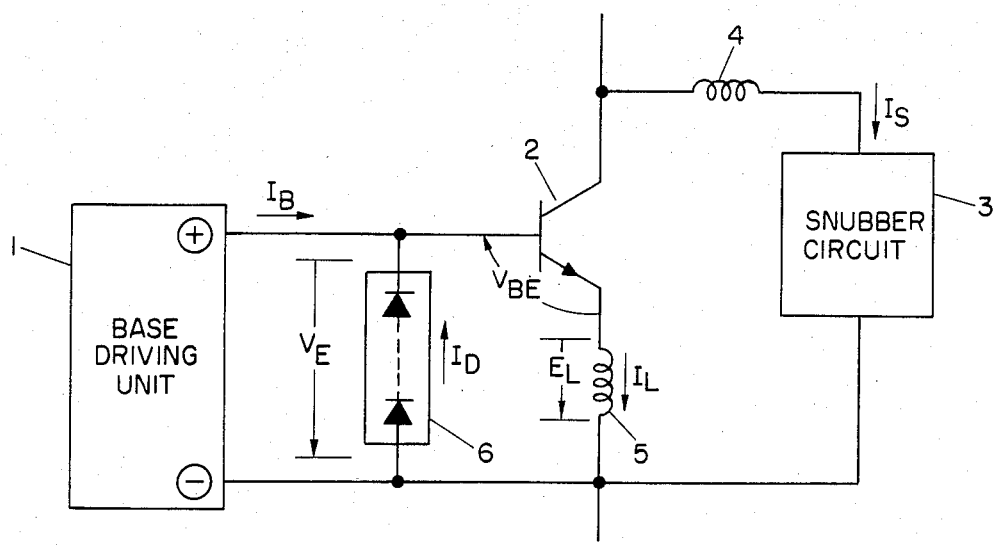
FIG. 3
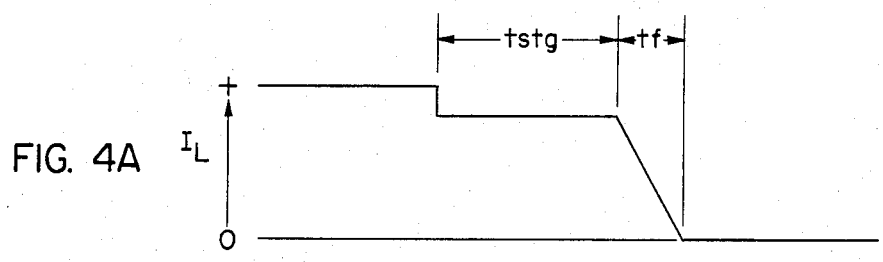
FIG. 4A  $I_L$
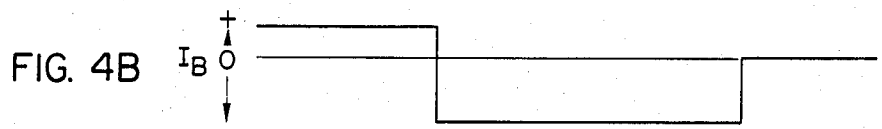
FIG. 4B  $I_B$
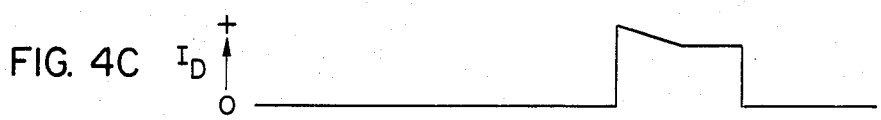
FIG. 4C  $I_D$
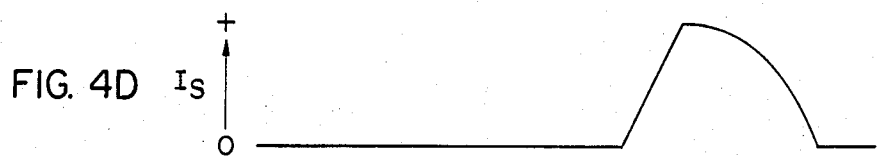
FIG. 4D  $I_S$

CONTROL CIRCUIT FOR SWITCHING TRANSISTORS

BACKGROUND OF THE INVENTION

This invention relates to control circuits for switching transistors and, more particularly, to a new and improved control circuit for a transistor which performs a switching action.

Conventional circuits for switching transistors include an emitter-collector snubber circuit which has a distributed inductance. When the transistor is switched off the energy stored in the distributed inductance produces a sharp voltage spike applied to the transistor. Efforts heretofore made to reduce this voltage spike have not been successful, especially in circuits using several transistors in parallel to provide increased current capacity. In addition, the noise generated in such circuits requires complicated measures to avoid interfering signals.

Accordingly, an object of the present invention is to provide a circuit for interrupting the operation of a switching transistor which is capable of reducing the rising rate (di/dt) of current flowing into a snubber circuit when a transistor used to perform switching action is switched off.

Another object of the invention is to provide such a circuit which is arranged to avoid structural restrictions and to provide higher reliability and also decrease the noise generated at the time of switching the transistor off.

SUMMARY OF THE INVENTION

These and other objects of the invention are accomplished by providing a reactor in series with the emitter of a switching transistor and at least one diode connected in series between the reactor and the base of the transistor, the diode being connected to the opposite end of the reactor from that connected to the emitter of the transistor, to supply to the base of the transistor the electromotive force which is generated by the reactor as the current decreases when the transistor is switched off.

BRIEF DESCRIPTION OF THE DRAWINGS

Further objects and advantages of the invention will be apparent from a reading of the following description in conjunction with the accompanying drawings, in which:

FIG. 3 is a schematic circuit diagram illustrating a representative embodiment of the present invention; and FIGS. 4A–4D are graphical waveform charts illustrating the operation of portions of the circuit of FIG. 3.

DESCRIPTION OF PREFERRED EMBODIMENTS

Figure 1:
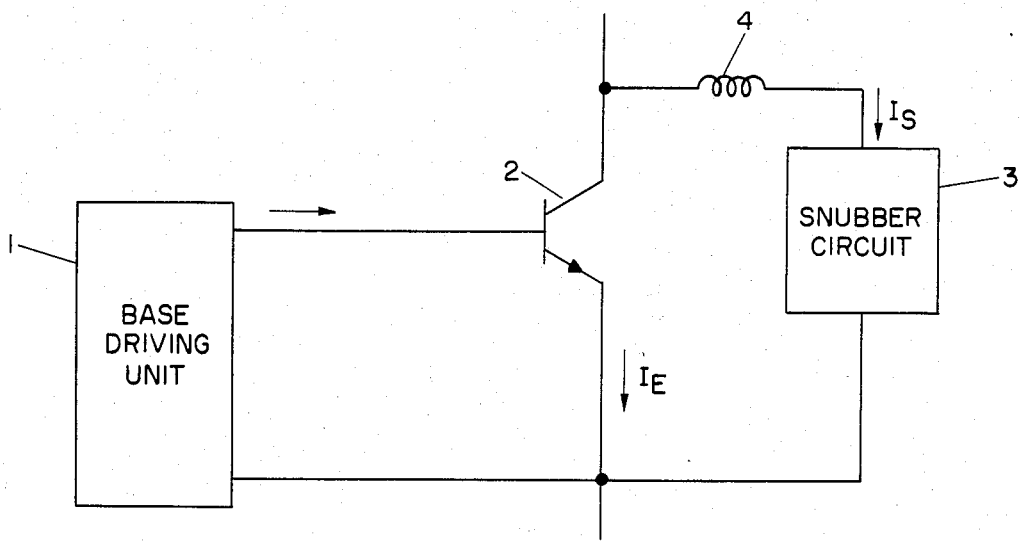
FIG. 1 is a schematic circuit diagram illustrating a conventional switching circuit using a transistor.

In a conventional circuit for switching an npn transistor on and off, as shown in FIG. 1, the output of a base driving unit 1 is connected across the base and emitter of the transistor 2 and a snubber circuit 3 is connected between the collector and emitter of the transistor. The coil designated 4 in FIG. 1 represents the distributed inductance of the snubber circuit 3 and the conductors joining the transistor to the snubber circuit 3.

Figure 2A:
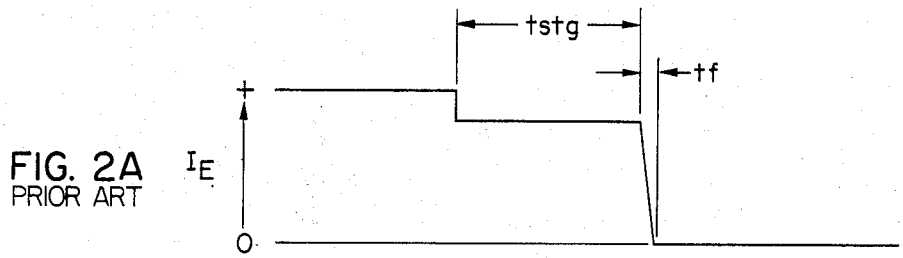
FIGS. 2A–2C are graphical waveform charts illustrating the operation of portions of the circuit of FIG. 1.
Figure 2B:
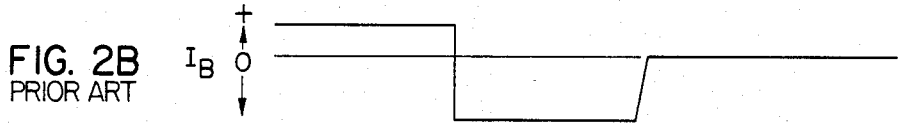
Figure 2C:
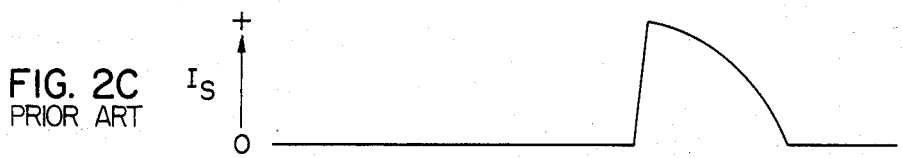

FIGS. 2A–2C show the waveforms in the portions of the circuit of FIG. 1. As shown in FIG. 2B, when the transistor 2 is on, the current $I_B$ is supplied from the base driving unit 1 to the base of the transistor 2. To switch the transistor off current is supplied from the emitter to the base during a storage time ($t_{stg}$) and a fall time ($t_f$).

In the switching circuit thus arranged, the energy stored in the distributed inductance while the transistor 2 is kept on is applied to the transistor 2 as a spike voltage when it is switched off. In order to reduce that voltage to a level below the maximum allowable level, a conventional snubber circuit 3 comprising a capacitor, a resistor, a diode, etc. is connected between the collector and emitter of the transistor 2. However, since the fall time (tf) of the transistor in this arrangement is extremely short ($t_f < 1$ μsec), the rising rate (di/dt) of the current flowing into the snubber circuit 3 when the transistor 2 is switched off becomes very high and, consequently, the inductance 4 of the snubber circuit 3 and along the conductors leading to the snubber circuit 3 must be made extremely small.

On the other hand, in large capacity circuits using several switching transistors, the circuit arrangement becomes large in size and requires a more complicated construction to reduce the inductance of the snubber circuit 3 and along the conductors leading to the snubber circuit 3. As a result, the reliability of the circuit is decreased and the circuit is more expensive because the components must be designed so that their inductance is minimized. Another disadvantage of such circuits is that, since the noise generation will also increase if a high current is switched on and off at high speed, complicated measures must be taken to avoid problems resulting from noise, thus increasing the cost of the circuit.

A representative embodiment of the present invention which avoids these problems will now be described in detail with respect to FIGS. 3 and 4A–4D. In FIG. 3 like reference numbers designate like or corresponding parts with respect to the circuit of FIG. 1. Thus, the circuit of the invention includes a switching transistor 2, a base driving unit 1 connected across the base and emitter of the transistor 2, a snubber circuit 3 connected across the collector and emitter thereof, and a distributed inductance 4.

In accordance with the invention, a reactor 5 is connected in series with the emitter of the transistor 2 and a diode arrangement 6, which may include a plurality of diodes connected in series, is connected between the end of the reactor 5 which is not connected to the emitter of the transistor 2 and the base of the transistor 2. Moreover, the diode 6 is connected in the direction such that the electromotive force of the reactor 5 which is generated as the current decreases when the transistor is switched off is applied to the base of the transistor through the diode arrangement 6.

The operation of the circuit will be described with reference to FIGS. 4A–4D which show operational waveforms for portions of the circuit. As shown in FIG. 4B, when the transistor 2 is kept on, the positive current $I_B$ is supplied from the base driving unit 1 to the transistor 2 and an opposite current is supplied to turn the transistor off. The collector current of the transistor 2 starts decreasing after the storage time ($t_{stg}$) and the fall time ($t_f$) when the current is supplied from the emitter to the base of the transistor.

At this time, because the current $I_L$ of the reactor 5 starts decreasing as shown in FIG. 4A, an electromotive force $E_L$ is induced in the reactor 5 toward the direction in which the terminal connected to the emitter of the transistor 2 becomes negative and the other terminal becomes positive. The electromotive force $E_L$ is given by $$E_L = L \cdot dI_L/dt$$

where L is inductance of the reactor 5 and $dI_L/dt$ is the current change rate. Assuming that the forward voltage of the group of diodes 6 is $V_F$ and the voltage across the base and emitter of the transistor 2 is $V_{BE}$ while the base driving unit 1 supplies a constant current $-I_B$ (inverse bias base current), the output current $-I_B$ of the base driving unit 1 under the condition of $E_L < V_{BE} + V_F$ will follow the path of (−) terminal reactor 5→emitter→base→(+) terminal, so as to reduce the fall time ($t_f$) of the collector current and cause $E_L$ to increase. Under the condition of $E_L > V_{BE} + V_F$, the output current of the base driving unit 1 will follow the path of (−) terminal→group of diodes 6→(+) terminal. At this time, the current from the reactor 5 is led to the base of the transistor 2 through the group of diodes 6, acting to prolong the fall time ($t_f$) of the collector current and cause $E_L$ to decrease.

Based on the aforementioned operation, the current $I_L$ of the reactor shows a fall characteristic which satisfies the condition of $E_L \rightleftarrows V_{BE} + V_F$. Since $E_L = L \cdot dI_L/dt$, the fall characteristic ($dI_L/dt$) may be adjusted by changing the forward voltage $V_F$ of the group of diodes 6 or the inductance of the reactor, provided that $V_{BE} \rightleftarrows$ constant.

Although the invention has been described herein with reference to a specific embodiment, many modifications and variations therein will readily occur to those skilled in the art. Accordingly, all such variation and modifications are included within the intended scope of the invention as defined by the following claim.

I claim:

1. A circuit arrangement including a switching transistor having emitter, base and collector electrodes, snubber circuit means including associated distributed reactance, inductance means, diode means and base driving means for switching the transistor characterized in that the emitter-collector circuit branch includes in series the inductance means and the snubber circuit means and the emitter-base circuit branch includes in series the inductance means and the parallel arrangement of the diode means and the base driving means, the diode means being poled such that the electromotive force generated in the inductance means as the current decreases when the transistor is switched off is applied to the base of the switching transistor.

* * * * *